(12) United States Patent
Teranishi

(10) Patent No.: US 12,424,456 B2
(45) Date of Patent: Sep. 23, 2025

(54) METHOD OF MANUFACTURING PACKAGE DEVICE

(71) Applicant: DISCO CORPORATION, Tokyo (JP)

(72) Inventor: Shunsuke Teranishi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 474 days.

(21) Appl. No.: 18/177,253

(22) Filed: Mar. 2, 2023

(65) Prior Publication Data

US 2023/0290651 A1 Sep. 14, 2023

(30) Foreign Application Priority Data

Mar. 9, 2022 (JP) .................... 2022-035907

(51) Int. Cl.
*H01L 21/56* (2006.01)
*H01L 21/304* (2006.01)
*H01L 21/78* (2006.01)
*H01L 23/00* (2006.01)

(52) U.S. Cl.
CPC .......... *H01L 21/561* (2013.01); *H01L 21/304* (2013.01); *H01L 21/78* (2013.01); *H01L 24/97* (2013.01); *H01L 2224/97* (2013.01)

(58) Field of Classification Search
None
See application file for complete search history.

(56) References Cited

U.S. PATENT DOCUMENTS

| 2011/0215470 A1* | 9/2011 | Chen ................. H01L 23/52 257/773 |
| 2015/0262972 A1* | 9/2015 | Katkar ............. H01L 25/0657 438/107 |
| 2019/0006263 A1* | 1/2019 | Yu .................. H01L 25/0657 |
| 2020/0051954 A1* | 2/2020 | Kim ................. H01L 24/32 |

FOREIGN PATENT DOCUMENTS

| JP | 2019512168 A | 5/2019 |
| WO | 2017143782 A1 | 8/2017 |

* cited by examiner

*Primary Examiner* — Erik T. K. Peterson
(74) *Attorney, Agent, or Firm* — Greer Burns & Crain Ltd.

(57) ABSTRACT

There is provided a method of manufacturing package devices, including a first substrate preparing step of preparing a first substrate in which a device chip is mounted in each of a plurality of mounting areas, a second substrate preparing step of preparing a second substrate including a plurality of recessed portions that are capable of housing the device chips, a bonding step of bonding the first substrate and the second substrate together in such a manner that the device chips are housed in the recessed portions, a grinding step of grinding the second substrate until the recessed portions are exposed, a resin molding step of supplying resin to the plurality of recessed portions and covering the device chips by the resin, and a dividing step of dividing the first substrate and the second substrate and manufacturing a plurality of package devices each including the device chips.

3 Claims, 16 Drawing Sheets

METHOD OF MANUFACTURING PACKAGE DEVICE

BACKGROUND OF THE INVENTION

Field of the Invention

The present invention relates to a method of manufacturing package devices that manufactures package devices by dividing a substrate on which device chips are mounted.

Description of the Related Art

The manufacturing process for device chips uses a wafer which has a device formed in each of a plurality of areas demarcated by a plurality of projected dicing lines (streets) in crisscross relation. Dividing the wafer along the projected dicing lines allows a plurality of device chips each including a device to be obtained. The device chips are incorporated in various kinds of electronic apparatuses such as mobile phones and personal computers.

In recent years, in association with the downsizing of the electronic apparatuses, there is a demand for miniaturization and high integration for device chips that are mounted on electronic apparatuses. Hence, a technique of packaging the plurality of device chips and forming package devices is put into practice. For example, the plurality of device chips mounted on a face side of a predetermined substrate are sealed by resin for sealing (mold resin), and a redistribution layer (RDL) and the like are formed on the substrate. Thereafter, the substrate is divided into individual chips, so that package devices including a plurality of device chips that are packaged are manufactured.

Sealing the plurality of device chips mounted on the substrate requires a resin layer to be formed with a thickness that can cover the device chips, over the entire area of the face side (device chip side) of the substrate. Hence, a large amount of resin is required for sealing device chips. Further, when the resin is cured after covering the face side of the substrate, the substrate is likely to warp due to contraction of the resin layer, the difference in thermal expansion coefficient between the substrate and the resin layer, or the like. The substrate being warped involves the risk of causing trouble to the subsequent processes to be performed on the substrate (formation of a thin film on the substrate, processing of the substrate, and the like) and further causing negative effects on the quality of the package devices. As such, there has been proposed a technique of providing, on the face side of the substrate, a plurality of recessed portions that can house device chips and mounting the device chips in the recessed portions (see JP-T-2019-512168). This technique enables the device chips to be sealed by resin filling the recessed portions in which the device chips are housed, making it unnecessary to perform the step of forming a thick resin layer over the entire area of the face side of the substrate. Consequently, the amount of resin necessary for sealing the device chips is reduced, and the substrate is less likely to warp.

SUMMARY OF THE INVENTION

In the case of mounting the device chips in the recessed portions of the substrate as described above, first, a plurality of recessed portions that can house the device chips are formed in the substrate. However, the plurality of recessed portions to be formed in the substrate have such a problem that variation is likely to occur in their depths. For example, the recessed portions are formed on the face side of the substrate by plasma etching gas being supplied to the substrate and dry etching being performed thereon. In this case, due to unbalanced flow of etching gas, variation in plasma density, or the like, etching rate is likely to vary in the substrate, causing a difference in the depth of the recessed portions between the central portion and the outer circumferential portion of the substrate. Moreover, depending on etching conditions, the total thickness variation (TTV) in the bottom face of the recessed portion increases, possibly causing variation in depth in each recessed portion.

Mounting the device chips on the substrate in such a manner that the device chips are supported at the bottom faces of the recessed portions having variation in depth causes variation also in the positions of the device chips in the thickness direction of the substrate (depth direction of the recessed portions). As a result, when through electrodes (through-silicon vias (TSVs)) and an RDL that are to be connected to the device chips in a subsequent step are to be formed, connection failure is likely to occur between the electrodes or the wires and the device chips, possibly reducing the quality of the package devices.

The present invention has been made in view of the abovementioned problems and has, as an object thereof, provision of a method of manufacturing package devices that is capable of reducing variation in the positions of the device chips mounted on the substrate.

In accordance with an aspect of the present invention, there is provided a method of manufacturing package devices, including a first substrate preparing step of preparing a first substrate including, on one surface, a plurality of mounting areas demarcated by a plurality of projected dicing lines in crisscross relation and having a device chip mounted in each of a plurality of the mounting areas, a second substrate preparing step of preparing a second substrate including, in one surface, a plurality of recessed portions that are provided in areas corresponding to the mounting areas and that are capable of housing the device chips, a bonding step of bonding together the first substrate and the second substrate in such a manner that the device chips are housed in the recessed portions, a grinding step of, after the bonding step, grinding the other surface of the second substrate until the recessed portions are exposed, a resin molding step of, after the grinding step, supplying resin to a plurality of the recessed portions and covering the device chips by the resin, and a dividing step of, after the resin molding step, dividing the first substrate and the second substrate along the projected dicing lines and manufacturing a plurality of package devices each including the device chips.

Preferably, the first substrate preparing step includes a planarizing step of planarizing the first substrate, and a mounting step of, after the planarizing step, mounting the device chips in the mounting areas. Moreover, preferably, the method of manufacturing package devices further includes a resin grinding step of, after the resin molding step, grinding the resin.

In the method of manufacturing package devices according to an aspect of the present invention, after the first substrate on which the device chips are mounted and the second substrate including the recessed portions are bonded together to allow the device chips to be housed in the recessed portions, the second substrate is ground, and the recessed portions are exposed. Further, in a state in which the device chips are supported on the flat first substrate, resin is supplied to the recessed portions, and the resin covers the device chips. Using the abovementioned method reduces the variation in the positions of the device chips in the depth direction of the recessed portions, compared to the case of supporting the device chips at the bottom faces of the recessed portions that are formed by such processing as dry etching and that have great variation in depth and great TTV. Consequently, a laminated substrate with device chips having uniform height is obtained.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment of the present invention will be described below with reference to the attached drawings. In the present embodiment, a first substrate (chip substrate) on which a plurality of device chips are mounted and a second substrate (bonded substrate) including a plurality of recessed portions that can house the device chips are bonded together to form a laminated substrate. By dividing the laminated substrate into individual chips, a plurality of package devices each including device chips that are packaged are manufactured. First, a configuration example of the first substrate and the second substrate that can be used for the method of manufacturing package devices according to the present embodiment will be described.

Figure 1A:
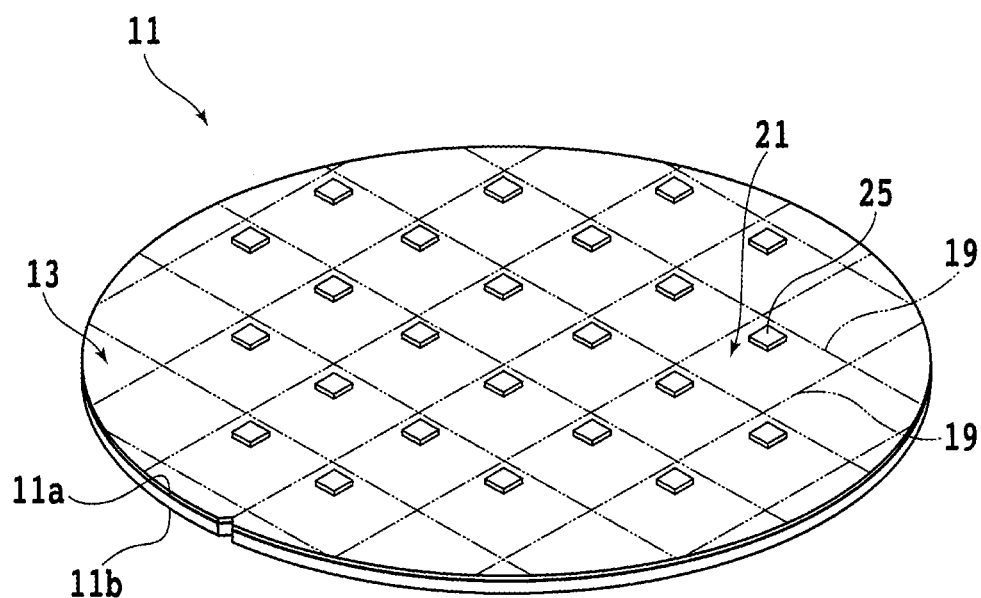
FIG. 1A is a perspective view illustrating a first substrate.
Figure 1B:
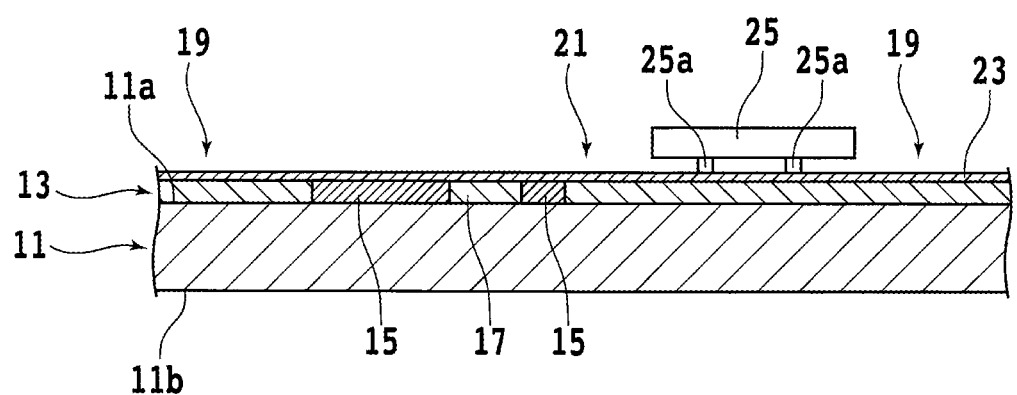
FIG. 1B is a cross sectional view illustrating part of the first substrate.

FIG. 1A is a perspective view illustrating the first substrate denoted by 11, and FIG. 1B is a cross sectional view illustrating part of the first substrate 11. For example, the first substrate 11 is a disk-shaped single-crystal silicon wafer and includes a face side (one surface; first surface) 11a and a reverse side (other surface; second surface) 11b that are substantially parallel to each other. Note that there are no limitations on the material, shape, structure, size, and the like of the first substrate 11. For example, the first substrate 11 may be a wafer formed of a semiconductor other than silicon (gallium arsenide (GaAs), indium phosphide (InP), gallium nitride (GaN), silicon carbide (SiC), or the like), glass (quartz glass, borosilicate glass, or the like), ceramic, resin, metal, or the like.

A wiring layer 13 is provided on the face side 11a of the first substrate 11. The wiring layer 13 includes various types of thin films such as a conductive film that functions as a wire, an electrode, a terminal, or the like and an insulating film that functions as an interlayer insulating film, and is formed over the entire area of the face side 11a of the first substrate 11. As illustrated in FIG. 1B, for example, the wiring layer 13 includes a conductive layer 15 composed of metal such as copper and an insulation layer 17 that is composed of oxide silicon ($SiO_2$), silicon nitride ($Si_3N_4$), or the like and that is formed in such a manner as to surround the conductive layer 15. Note that there is no limitation on the method of forming the wiring layer 13. For example, first, a metal film is formed on the face side 11a of the first substrate 11, and then patterned to a predetermined shape by a photolithography step. Thereafter, the metal film is covered with an insulating film, an opening is provided at a predetermined position in the insulating film, and the metal film is exposed, so that the wiring layer 13 is formed. Further, the wiring layer 13 can also be formed by forming an insulating film on the face side 11a of the first substrate 11, patterning the insulating film to a predetermined shape, and then filling with a metal material the area from which the insulating film has been removed.

The first substrate 11 is demarcated into a plurality of mounting areas 21 by a plurality of projected dicing lines (streets) 19 that are arrayed in a grid pattern in crisscross relation. The mounting area 21 corresponds to a rectangular area that is positioned on the face side 11a (wiring layer 13 side) of the first substrate 11 and that is surrounded by the projected dicing lines 19.

The plurality of mounting areas 21 each have a device chip 25 mounted therein. For example, the device chip 25 is a chip including passive components such as capacitors and resistors. Alternatively, the device chip 25 may be a chip including semiconductor devices exemplified by integrated circuits (ICs), large scale integration (LSI) circuits, light emitting diodes (LEDs), and micro electro mechanical systems (MEMS). On a bottom face side of the device chip 25, connection terminals 25a for connecting the device chip 25 to other wires, electrodes, device chips, or the like are provided. For example, the connection terminals 25a include bumps and the like. Note that there are no limitations on the type, shape, structure, size, and the like of the device chips 25.

As illustrated in FIG. 1B, for example, the device chis 25 is fixed to the mounting area 21 of the first substrate 11 via an adhesive layer 23 (not illustrated in FIG. 1A). The adhesive layer 23 is formed by application of an adhesive agent composed of resin or the like to the entire area of the face side 11a (the wiring layer 13 side) of the first substrate 11. The device chip 25 is firmly fixed to the adhesive layer 23 in such a manner as to overlap with the mounting area 21 of the first substrate 11. As a result, the device chip 25 is mounted in each of the plurality of mounting areas 21. FIGS. 1A and 1B illustrate an example in which the device chip 25 is mounted on a corner portion of the mounting area 21.

Figure 2A:
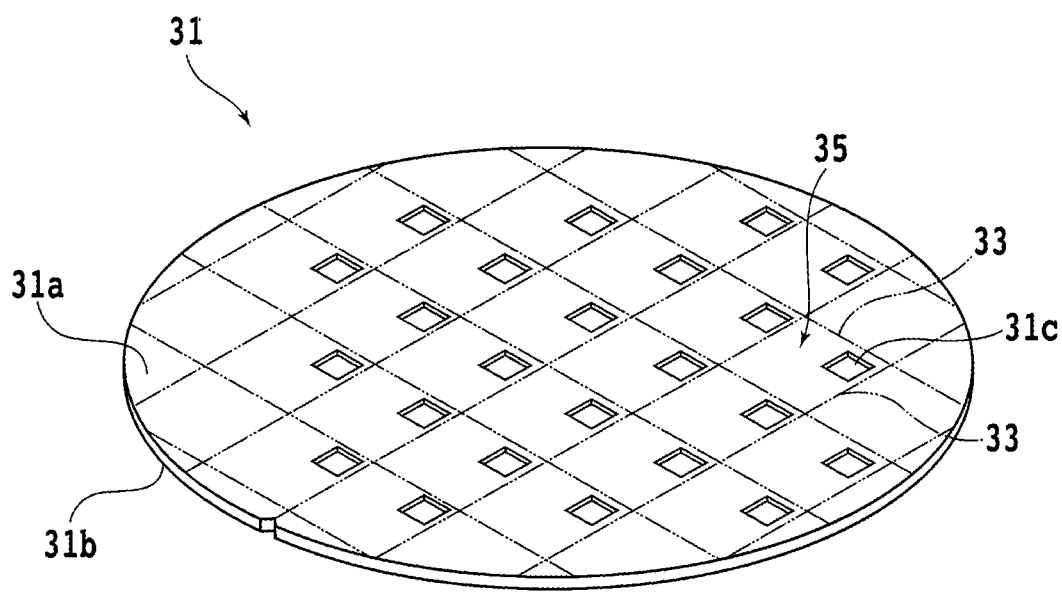
FIG. 2A is a perspective view illustrating a second substrate.
Figure 2B:
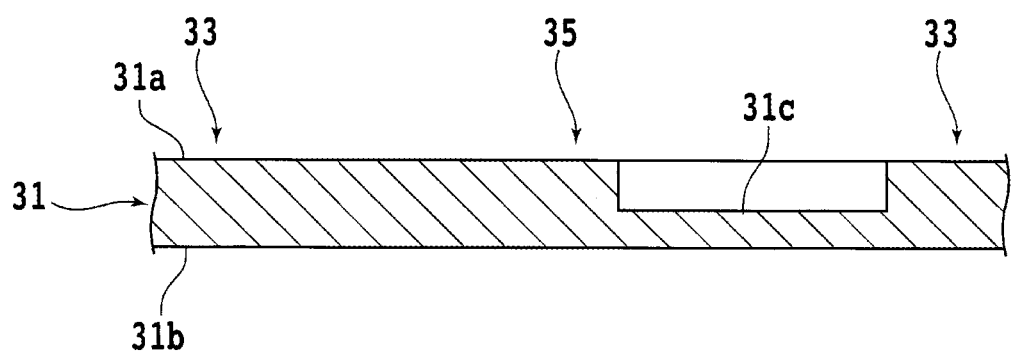
FIG. 2B is a cross sectional view illustrating part of the second substrate.

FIG. 2A is a perspective view illustrating a second substrate 31, and FIG. 2B is a cross sectional view illustrating part of the second substrate 31. The second substrate 31 corresponds to a bonded substrate which is to be bonded to the first substrate 11 in a subsequent step. For example, the second substrate 31 is a disk-shaped single-crystal silicon wafer and has a face side (one surface; first surface) 31a and a reverse side (other surface; second surface) 31b that are substantially parallel to each other. The material, shape, structure, size, and the like of the second substrate 31 are similar to those of the first substrate 11, and there are no limitations on them. Note that, since the second substrate 31 is to be processed simultaneously with the first substrate 11 in the subsequent step (see FIG. 16A), the material of the first substrate 11 and the material of the second substrate 31 are preferably the same.

The second substrate 31 is demarcated into a plurality of housing areas 35 by a plurality of projected dicing lines (streets) 33 that are arrayed in a grid pattern in crisscross relation. The housing area 35 corresponds to a rectangular area that is located on the face side 31a of the second substrate 31 and that is surrounded by the projected dicing lines 33.

The plurality of housing areas 35 are each provided with a recessed portion (housing portion) 31c that can house the device chip 25 (see FIGS. 1A and 1B). FIGS. 2A and 2B illustrate an example in which the recessed portion 31c is formed at a corner portion of the housing area 35. The recessed portion 31c is formed in an area corresponding to the mounting area 21 of the first substrate 11 (see FIGS. 1A and 1B), from the face side 31a toward the reverse side 31b of the second substrate 31. Specifically, the plurality of recessed portions 31 are each disposed at a position where the recessed portion 31c overlaps with the device chip 25 when the first substrate 11 and the second substrate 31 are disposed one on top the other in such a manner that the face side 11a of the first substrate 11 and the face side 31a of the second substrate 31 face each other. The shape and dimension of the recessed portions 31c are set such that the device chips 25 can be housed inside the recessed portions 31c. For example, the recessed portions 31c are formed in a rectangular parallelepiped shape. The length and width of the recessed portions 31c are set to have values greater than the length and width of the device chips 25. The depth of the recessed portions 31c is set to a value greater than the thickness of the device chips 25.

The recessed portions 31c can be formed by dry etching partially being performed on each of the plurality of housing areas 35. Specifically, first, a mask layer is formed on the face side 31a of the second substrate 31. The mask layer is patterned in such a manner that only the areas in which the recessed portions 31c are to be formed in the face side 31a of the second substrate 31 are exposed. Thereafter, plasma etching gas is supplied to the second substrate 31 via the mask layer. As a result, plasma etching is partially performed on the housing areas 35, so that the recessed portions 31c is formed. Note that the shape and dimension of the recessed portions 31c can be adjusted by patterning of the mask layer. Further, the depth of the recessed portions 31c can be adjusted by controlling the etching rate and etching time.

Note that there is no limitation on the method of forming the recessed portions 31c. For example, the recessed portions 31c may be formed by laser processing being performed on the second substrate 31. A laser processing apparatus is used for laser processing. The laser processing apparatus includes a chuck table that holds a workpiece and a laser application unit that applies a laser beam to the workpiece. The laser application unit includes a laser oscillator that generates such a laser as an yttrium aluminum garnet (YAG) laser, an yttrium vanadate ($YVO_4$) laser, or an yttrium lithium fluoride (YLF) laser and a laser processing head disposed above the chuck table. The laser processing head incorporates therein an optical system that guides the pulsed laser beam emitted from the laser oscillator, toward the workpiece, and the optical system includes an optical element such as a condenser lens that condenses the laser beam. By the laser beam emitted from the laser processing head, the workpiece held on the chuck table is processed.

For example, by ablation processing being performed on the second substrate 31, the recessed portions 31c are formed. In this case, the application conditions of the laser beam are set such that the areas of the second substrate 31 that are irradiated with the laser beam are removed by ablation processing. Specifically, the wavelength of the laser beam is set such that at least part of the laser beam is absorbed by the second substrate 31. That is, the laser application unit applies, to the second substrate 31, a laser beam having a wavelength absorbable by the second substrate 31. Other application conditions of the laser beam are also set such that ablation processing is appropriately performed on the second substrate 31. Further, by the laser beam being applied to the housing area 35 of the second substrate 31 and scanning being performed inside the housing area 35, the face side 31a of the second substrate 31 is partially removed, and the recessed portion 31c is formed.

Alternatively, the recessed portion 31c may be formed by the second substrate 31 being modified by application of a laser beam. In this case, the application conditions of the laser beam are set such that the areas of the second substrate 31 that are irradiated with the laser beam are modified and altered by multiphoton absorption. Specifically, the wavelength of the laser beam is set such that at least part of the laser beam transmits through the second substrate 31. That is, the laser application unit applies, to the second substrate 31, a laser beam having a wavelength transmittable by the second substrate 31. Other application conditions of the laser beam are also set such that the second substrate 31 is appropriately modified. When the laser beam is applied to the second substrate 31 under the abovementioned application conditions, the inside of the second substrate 31 is modified and altered by multiphoton absorption, and a modified layer (altered layer) is formed inside the second substrate 31. An area in which the modified layer is formed in the second substrate 31 becomes vulnerable compared to other areas. Hence, for example, forming a rectangular modified layer in the housing area 35 and thereafter applying external force to an internal area of the modified layer and hollowing out the area allow the recessed portion 31c to be formed.

Further, the recessed portions 31c can be formed by fragmentation processing being performed on the second substrate 31. For example, the recessed portions 31c are formed by such fragmentation processing as sandblasting, water jetting, and drilling. In the sandblasting, a sandblasting unit that jets abrasives is used. For example, the sandblasting unit includes a compressor that compresses gas such as air and sends it out and a blast gun that jets abrasives together with compressed gas. The abrasives jetted from the sandblasting unit strike the second substrate 31, so that the second substrate 31 is processed, and the recessed portion 31c is formed. In the water jetting, a water jetting unit that jets liquid such as water is used. The water jetting unit includes a nozzle for jetting liquid pressurized by a pump. Note that the liquid may contain abrasive grains. The liquid jetted from the water jetting unit strikes the second substrate 31, so that the second substrate 31 is processed, and the recessed portion 31c is formed. In the drilling, a drilling unit on which rod-shaped drill bits are mounted is used. The drilling unit includes a rotary drive source such as a motor that rotates the drill bits mounted on the drilling unit. By causing the tip end portions of the drill bits to come into contact with the second substrate 31 while the drill bits are being rotated, the second substrate 31 is processed, and the recessed portion 31c is formed.

Figure 3:
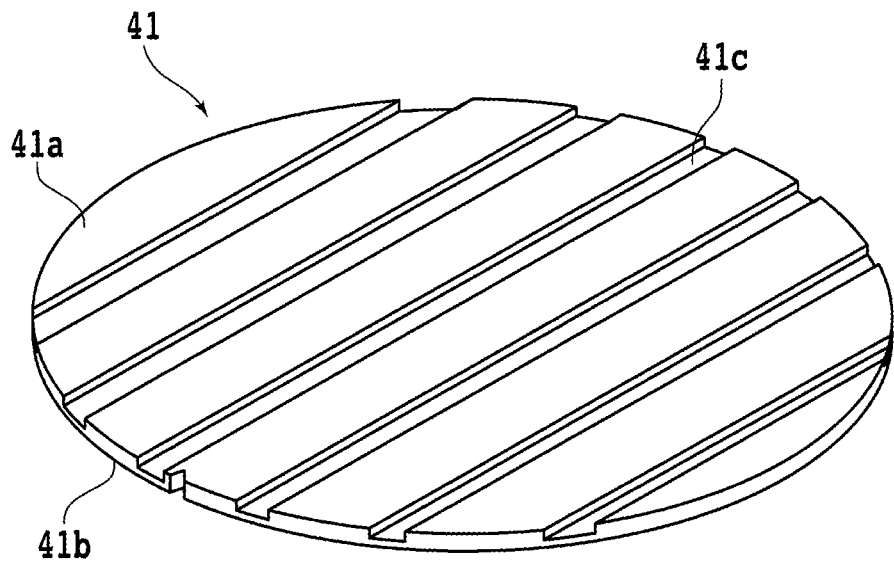
FIG. 3 is a perspective view illustrating a modification of the second substrate.

Note that, in place of the second substrate 31, a second substrate including recessed portions in which a plurality of device chips 25 can be housed may be used. FIG. 3 is a perspective view illustrating a second substrate 41 that corresponds to a modification of the second substrate 31.

The second substrate 41 includes a face side (one surface; first surface) 41a and a reverse side (other surface; second surface) 41b that are substantially parallel to each other. Note that the material, shape, structure, size, and the like of the second substrate 41 are similar to those of the second substrate 31 (see FIG. 2A); there are no limitation thereon. Yet, on the face side 41a of the second substrate 41, a plurality of recessed portions (housing portions) 41c formed in a strip shape are provided. The plurality of recessed portions 41c are formed substantially parallel to each other and are arrayed at an interval corresponding to the pitch of the device chips 25 (see FIGS. 1A and 1B). Note that both ends of the recessed portions 41c are exposed on the lateral sides of the second substrate 41. Further, the width of the recessed portion 41c is set to have a value greater than the width of the device chips 25, and the depth of the recessed portion 41c is set to have a value greater than the thickness of the device chips 25. Hence, the recessed portions 41c can each house a plurality of device chips 25.

For example, the recessed portions 41c are formed by the abovementioned dry etching, laser processing, fragmentation processing, or the like. Further, the recessed portions 41c can be formed by cutting processing that cuts a workpiece by an annular cutting blade. A cutting apparatus is used in the cutting processing. The cutting apparatus includes a chuck table that holds the workpiece and a cutting unit that performs cutting processing on the workpiece. The cutting unit incorporates therein a spindle, and a cutting blade is mounted on a distal end portion of the spindle. By the second substrate 41 being held on the chuck table and the cutting blade being caused to cut into the second substrate 41 while rotating, the second substrate 41 is cut. In the case of forming the recessed portion 41c in the second substrate 41, the cutting depth of the cutting blade is set to a target value of a depth of the recessed portion 41c, and the rotating cutting blade is caused to cut into the face side 41a of the second substrate 41 along a horizontal direction. Note that the width of the recessed portion 41c can be adjusted by the width of the cutting blade and the number of times of cutting to be performed by the cutting blade.

A method of manufacturing package devices with use of the abovementioned first substrate 11 and second substrate 31 or second substrate 41 will next be described. In the following description, as one example, a specific example of a method of manufacturing package devices with use of the first substrate 11 and the second substrate 31 will be described. Yet, also in the case of using the first substrate 11 and the second substrate 41, package devices can be manufactured by similar steps.

Figure 4A:
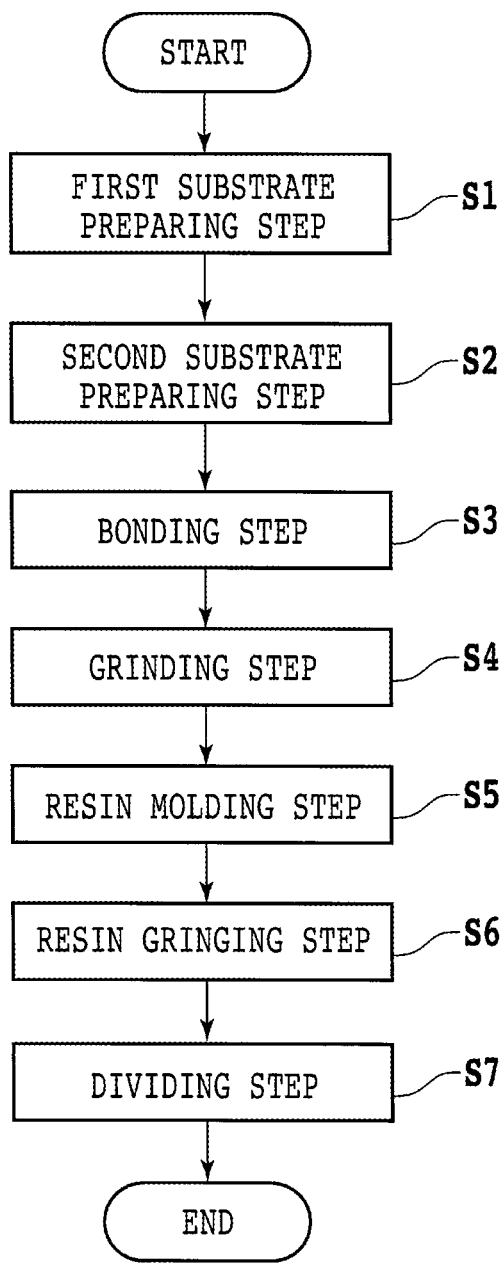
FIG. 4A is a flowchart illustrating a method of manufacturing package devices.
Figure 4B:
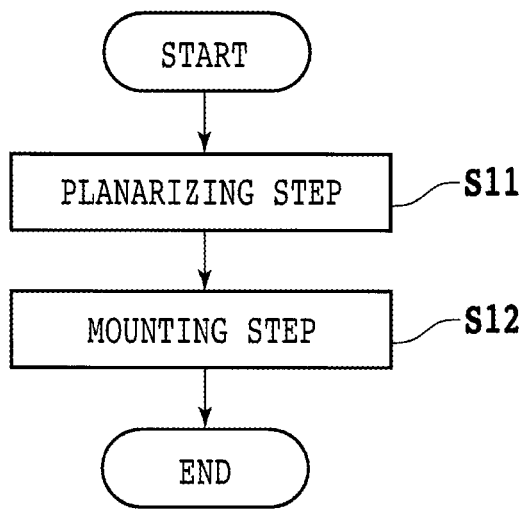
FIG. 4B is a flowchart illustrating a first substrate preparing step.

FIG. 4A is a flowchart illustrating the method of manufacturing package devices. When package devices are to be manufactured, first, a first substrate preparing step S1 of preparing the first substrate 11 and a second substrate preparing step S2 of preparing the second substrate 31 are performed. In the first substrate preparing step S1, the first substrate 11 illustrated in FIGS. 1A and 1B is formed. In the second substrate preparing step S2, the second substrate 31 illustrated in FIGS. 2A and 2B is formed. FIG. 4B is a flowchart illustrating the first substrate preparing step S1. For example, the first substrate preparing step S1 includes a planarizing step S11 of planarizing the first substrate 11 and a mounting step S12 of mounting the device chips 25 in the mounting areas 21 of the first substrate 11.

Figure 5:
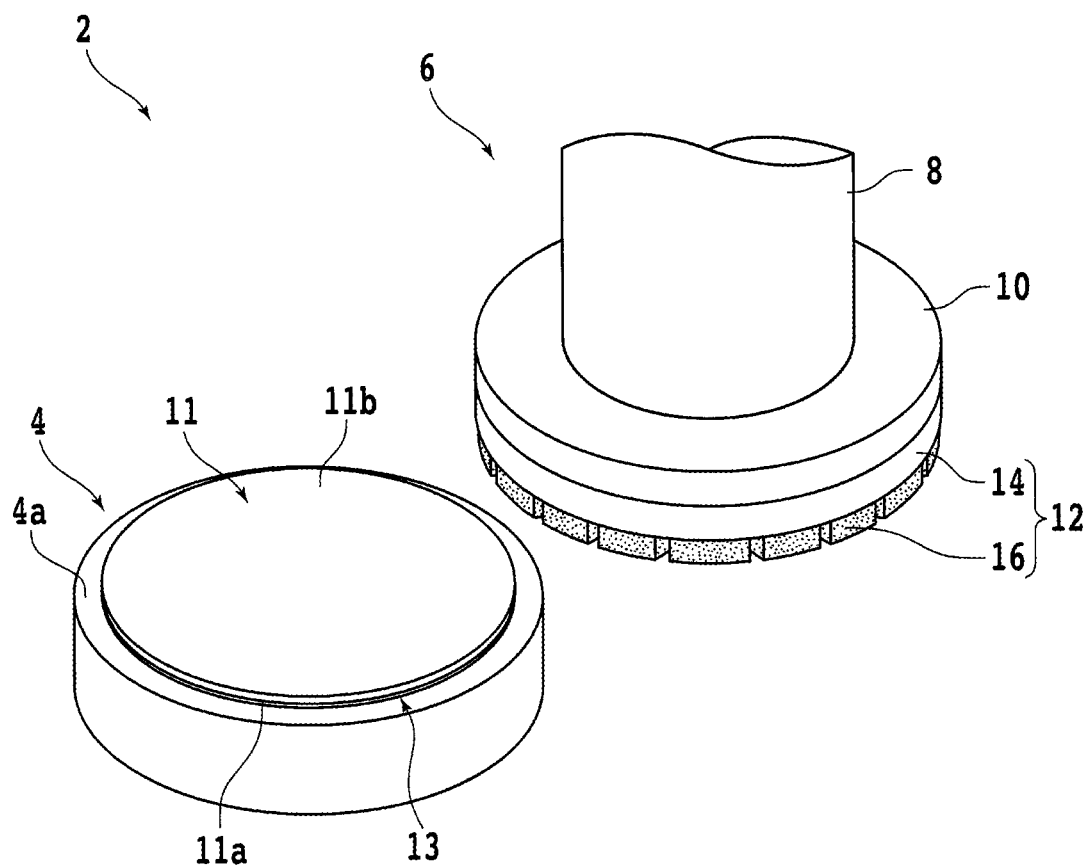
FIG. 5 is a perspective view illustrating the first substrate in a planarizing step.

FIG. 5 is a perspective view illustrating the first substrate 11 in the planarizing step S11. For example, in the planarizing step S11, the first substrate 11 is ground by a grinding apparatus 2. The grinding apparatus 2 includes a chuck table (holding table) 4 that holds the first substrate 11 and a grinding unit 6 that grinds the first substrate 11.

An upper surface of the chuck table 4 is a flat surface substantially parallel to a horizontal plane and configures a holding surface 4a for holding the first substrate 11. The holding surface 4a is connected to a suction source (not illustrated) such as an ejector via a flow channel (not illustrated) formed inside the chuck table 4. The chuck table 4 is coupled to a movement unit (not illustrated) that moves the chuck table 4 along a horizontal direction. As the movement unit, a movement mechanism of a ball screw type, a turn table, or the like is used. The chuck table 4 is further coupled to a rotary drive source (not illustrated) such as a motor that rotates the chuck table 4 about a rotational axis that is substantially parallel to the vertical direction (up-down direction; height direction).

On top of the chuck table 4, the grinding unit 6 is disposed. The grinding unit 6 includes a cylindrical spindle 8 that is disposed along the vertical direction. To a distal end portion (lower end portion) of the spindle 8, a disk-shaped mount 10 made of metal or the like is fixed. Further, to a base end portion (upper end portion) of the spindle 8, a rotary drive source (not illustrated) such as a motor that rotates the spindle 8 is coupled.

To a lower surface side of the mount 10, a grinding wheel 12 for grinding the first substrate 11 is mounted. The grinding wheel 12 is composed of such metal as stainless steel or aluminum and has an annular wheel base 14 that is formed to have substantially the same diameter as the mount 10. To a lower surface side of the wheel base 14, a plurality of grindstones 16 are fixed. For example, the grindstones 16 are formed in the shape of a rectangular parallelepiped and are annularly arrayed at substantially equal intervals along the outer circumference of the wheel base 14.

The grinding wheel 12 rotates about the rotational axis that is substantially parallel to the vertical direction by power transmitted from the rotary drive source via the spindle 8 and the mount 10. To the grinding unit 6, a movement mechanism of a ball screw type (not illustrated) that lifts and lowers the grinding unit 6 along the vertical direction is coupled. Further, inside or near the grinding unit 6, there is provided a grinding liquid supply channel (not illustrated) such as a nozzle for supplying liquid (grinding liquid) such as pure water to the first substrate 11 held on the chuck table 4 and the grindstones 16.

When the first substrate 11 is to be ground by the grinding apparatus 2, first, the first substrate 11 is held on the chuck table 4. Specifically, the first substrate 11 is disposed on the chuck table 4 in such a manner that the face side 11a (wiring layer 13 side) faces the holding surface 4a and the reverse side 11b is exposed upward. When suction force (negative pressure) generated by the suction source is caused to act on the holding surface 4a in this state, the face side 11a of the first substrate 11 is held under suction on the chuck table 4.

When the first substrate 11 is to be ground by the grinding apparatus 2, a protective member may be affixed to the face side 11a (wiring layer 13 side) of the first substrate 11. For example, a circular protective tape formed to have substantially the same diameter as the first substrate 11 is affixed to the face side 11a of the first substrate 11 to cover the entire area thereof. As a result, the wiring layer 13 is protected. The protective tape includes a film-like base and an adhesive layer (glue layer) provided above the base. For example, the base is composed of resin such as polyolefin, polyvinyl chloride, or polyethylene terephthalate. Further, the adhesive layer is composed of an epoxy adhesive agent, an acrylic adhesive agent, a rubber adhesive agent, or the like. Moreover, as the adhesive agent, an ultraviolet curable resin that cures by being irradiated with ultraviolet can be used.

Next, the chuck table 4 is moved to a position below the grinding unit 6. Then, while the chuck table 4 and the grinding wheel 12 are rotated, the grinding wheel 12 is lowered toward the chuck table 4. As a result, the grindstones 16 come into contact with the reverse side 11b of the first substrate 11, and the reverse side 11b of the first substrate 11 is ground off. In this manner, the reverse side 11b of the first substrate 11 is ground, and the first substrate 11 is thinned. When the first substrate 11 is thinned to reach a predetermined thickness, grinding is stopped. When the reverse side 11b of the first substrate 11 is ground by the grinding apparatus 2, the first substrate 11 is thinned in whole such that the first substrate 11 has a substantially uniform thickness. As a result, the first substrate 11 is planarized, and the thickness variation in the surface of the first substrate 11 is reduced.

In the planarizing step S11, instead of or in addition to grinding the reverse side 11b of the first substrate 11, a planarizing process may be performed on the face side 11a of the first substrate 11. For example, the face side of the wiring layer 13 is planarized by cutting using a turning tool. Further, prior to the wiring layer 13 being formed on the face side 11a of the first substrate 11, the face side 11a of the first substrate 11 may be planarized by being ground by the grindstones 16. Performing the planarizing process on both the face side 11a and the reverse side 11b of the first substrate 11 further reduces the thickness variation in the surface of the first substrate 11.

Figure 6:
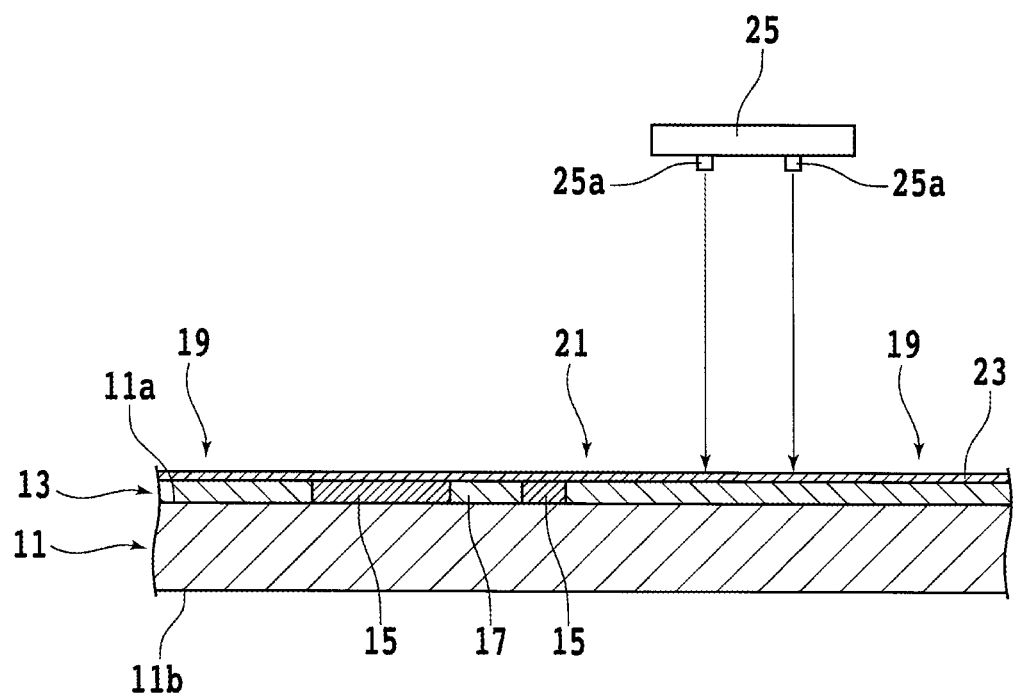
FIG. 6 is a cross sectional view illustrating part of the first substrate in a mounting step.

Next, device chips 25 are mounted in the mounting areas 21 of the first substrate 11 (mounting step S12). FIG. 6 is a cross sectional view illustrating part of the first substrate 11 in the mounting step S12. In the mounting step S12, first, the adhesive layer 23 is formed on the face side 11a of the first substrate 11. Thereafter, the connection terminals 25a of the device chip 25 are stuck to the portions of the adhesive layer 23 that overlap with the mounting area 21. Consequently, the device chips 25 are mounted in the mounting area 21 of the first substrate 11. Note that there is no limitation on the method of fixing the device chips 25 to the first substrate 11.

As described above, planarizing the first substrate 11 prior to mounting the device chips 25 makes it possible to make uniform the height positions (positions in the thickness direction of the first substrate 11) of the plurality of device chips 25 mounted on the first substrate 11. Yet, in a case where the thickness variation in the surface and surface roughness of the first substrate 11 are small enough to be ignored, the planarizing step S11 may be omitted.

In the second substrate preparing step S2, the second substrate 31 (see FIGS. 2A and 2B) in which the recessed portions 31c are formed by the abovementioned method is prepared. Note that there is no limitation on the order of performing the first substrate preparing step S1 and the second substrate preparing step S2. For example, the first substrate 11 and the second substrate 31 may be formed independently of each other at different timings or may be formed simultaneously.

Figure 7A:
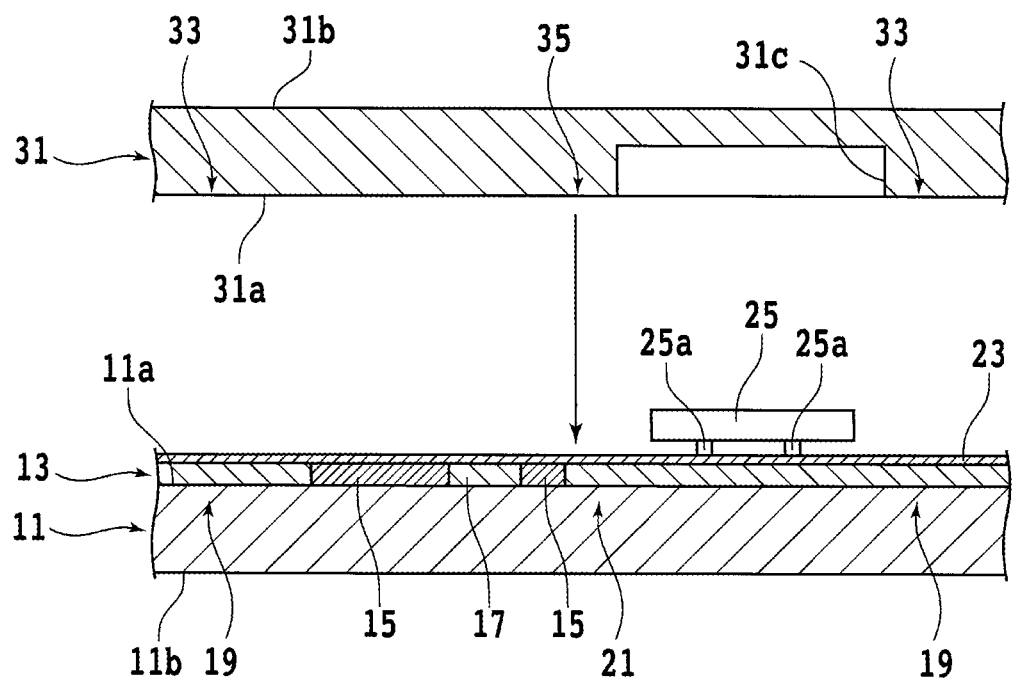
FIG. 7A is a cross sectional view illustrating part of the first substrate and part of the second substrate in a bonding step.

Next, the first substrate 11 and the second substrate 31 are bonded together in such a manner that the device chips 25 mounted on the first substrate 11 are housed in the recessed portions 31c of the second substrate 31 (bonding step S3). FIG. 7A is a cross sectional view illustrating part of the first substrate 11 and part of the second substrate 31 in the bonding step S3.

In the bonding step S3, first, the first substrate 11 and the second substrate 31 are disposed in a concentric manner in plan view such that the face side 11a (device chip 25 side) of the first substrate 11 and the face side 31a (recessed portion 31c side) of the second substrate 31 face each other. At this time, the first substrate 11 and the second substrate 31 are disposed in such a manner that the recessed portions 31c of the second substrate 31 each overlap with the device chip 25. In this state, the face side 11a of the first substrate 11 and the face side 31a of the second substrate 31 are bonded together with the adhesive layer 23 interposed therebetween. As a result, the first substrate 11 and the second substrate 31 are stacked one on top of the other.

Figure 7B:
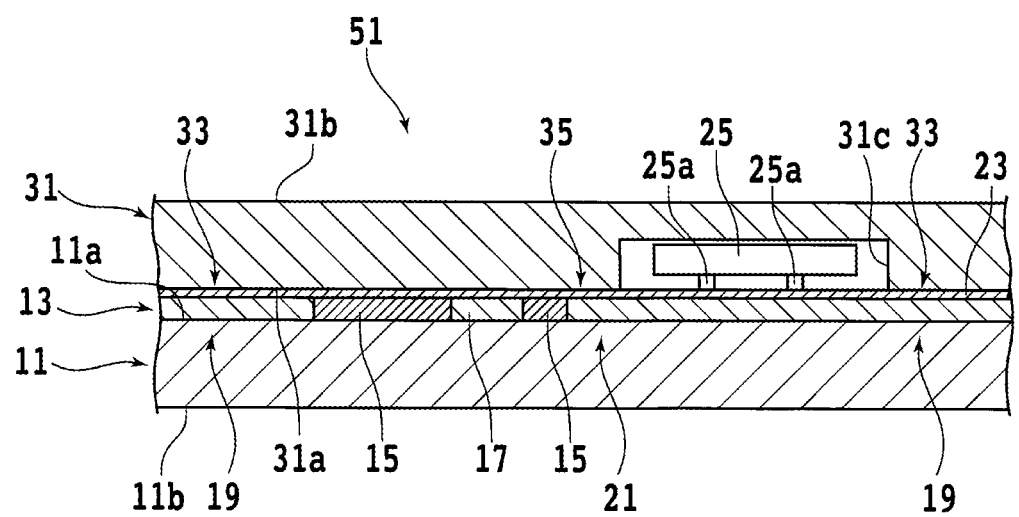
FIG. 7B is a cross sectional view illustrating part of the first substrate and part of the second substrate that have undergone the bonding step.

FIG. 7B is a cross sectional view illustrating part of the first substrate 11 and part of the second substrate 31 that have undergone the bonding step S3. When the first substrate 11 and the second substrate 31 are bonded together, the device chips 25 are each housed in the respective recessed portion 31c and covered by the second substrate 31. At this time, gaps are formed between the device chip 25 and side walls and a bottom face of the recessed portion 31c. In this manner, a laminated substrate 51 including the first substrate 11 and the second substrate 31 stacked one on top of the other is formed.

Note that, in the case where the first substrate 11 is a crystalline wafer, a cutout (notch, orientation flat, etc.) that indicates the crystal orientation of the first substrate 11 may be formed on the outer circumferential portion of the first substrate 11 (see FIG. 1A). Similarly, in the case where the second substrate 31 is a crystalline wafer, a cutout (notch, orientation flat, etc.) that indicates the crystal orientation of the second substrate 31 may be formed on the outer circumferential portion of the second substrate 31 (see FIG. 2A). In this case, the crystal orientation of the first substrate 11 and the crystal orientation of the second substrate 31 may be aligned by the first substrate 11 and the second substrate 31 being bonded together in such a manner that the cutout of the first substrate 11 overlaps with the cutout of the second substrate 31.

Figure 8:
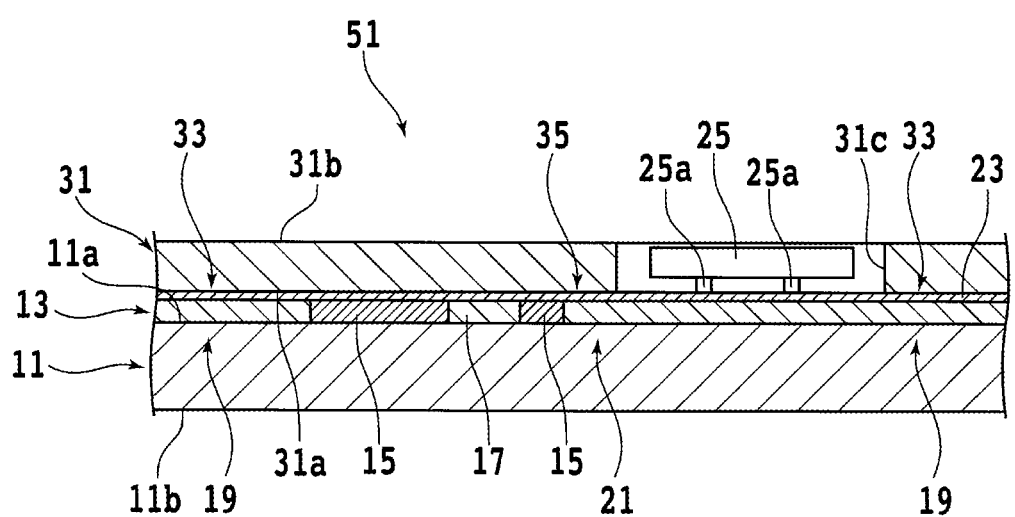
FIG. 8 is a cross sectional view illustrating part of a laminated substrate in a grinding step.

Next, the reverse side 31b of the second substrate 31 is ground until the recessed portions 31c are exposed (grinding step S4). FIG. 8 is a cross sectional view illustrating part of the laminated substrate 51 in the grinding step S4.

For example, in the grinding step S4, the laminated substrate 51 is ground by the grinding apparatus 2 (see FIG. 5). Specifically, the laminated substrate 51 is disposed on the chuck table 4 in such a manner that the reverse side 11b of the first substrate 11 faces the holding surface 4a and the reverse side 31b of the second substrate 31 is exposed upward. Then, while the chuck table 4 and the grinding wheel 12 are rotated, the grindstones 16 are caused to come into contact with the reverse side 31b of the second substrate 31. As a result, the reverse side 31b of the second substrate 31 is ground and thinned. Grinding of the second substrate 31 is continued until the recessed portions 31c are exposed on the reverse side 31b of the second substrate 31. Hence, when grinding of the second substrate 31 is completed, the recessed portions 31c become columnar through holes that penetrate the second substrate 31 in the thickness direction. Further, upper surface sides of the device chips 25 that are disposed inside the recessed portions 31c are exposed upward.

Figure 9:
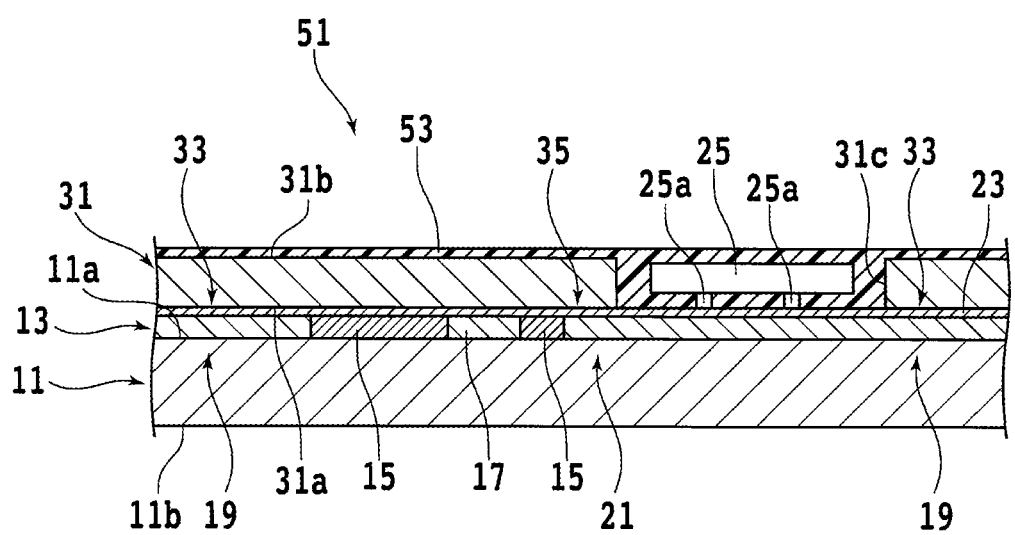
FIG. 9 is a cross sectional view illustrating part of the laminated substrate in a resin molding step.

Next, resin is supplied to the plurality of recessed portions 31c to cover the device chips 25 (resin molding step S5). FIG. 9 is a cross sectional view illustrating part of the laminated substrate 51 in the resin molding step S5.

In the resin molding step S5, resin (mold resin; sealing member) 53 is applied to the reverse side 31b of the second substrate 31, and is supplied to the plurality of recessed portions 31c that are exposed on the reverse side 31b of the second substrate 31. For example, the resin 53 is applied to the reverse side 31b of the second substrate 31 in a state of being heated and softened, and flows into the recessed portion 31c in such a manner as to fill the gaps between the device chip 25 and the side walls and bottom face of the recessed portion 31c. As a result, the recessed portions 31c are filled with the resin 53, and a thin film (which has, for example, a thickness of approximately 100 μm) composed of the resin 53 is formed on the reverse side 31b of the second substrate 31. Thereafter, the resin 53 is cooled and cured over time. As a result, the device chips 25 are sealed by the resin 53. There is no limitation on the material of the resin 53 as long as the device chips 25 can be sealed. For example, insulating synthetic resin such as epoxy resin, silicone resin, urethan resin, unsaturated polyester resin, acrylic urethane resin, or polyimide resin may be used as the resin 53.

In the abovementioned resin molding step S5, the device chips 25 are sealed once the recessed portions 31c are filled with the resin 53, making it unnecessary to form a thick resin layer on the reverse side 31b of the second substrate 31. This reduces the amount of use of the resin 53 and makes it less likely for the laminated substrate 51 to warp due to contraction of the resin 53.

Figure 10:
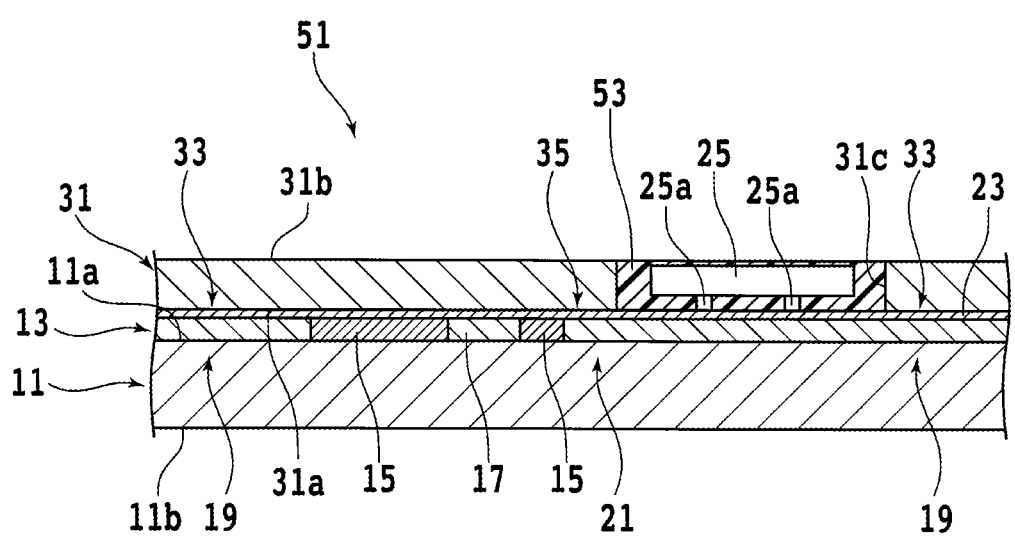
FIG. 10 is a cross sectional view illustrating part of the laminated substrate in a resin grinding step.

Next, the resin 53 is ground (resin grinding step S6). FIG. 10 is a cross sectional view illustrating part of the laminated substrate 51 in the resin grinding step S6.

For example, in the resin grinding step S6, the resin 53 is ground by the grinding apparatus 2 (see FIG. 5). Specifically, first, the laminated substrate 51 is disposed on the chuck table 4 in such a manner that the reverse side 11b of the first substrate 11 faces the holding surface 4a and the reverse side 31b (resin 53 side) of the second substrate 31 is exposed upward. Then, while the chuck table 4 and the grinding wheel 12 are rotated, the grindstones 16 are caused to come into contact with the resin 53. As a result, the resin 53 formed on the reverse side 31b of the second substrate 31 is ground. Grinding of the resin 53 is continued until the resin 53 formed on the reverse side 31b of the second substrate 31 is removed. When grinding of the resin 53 is completed, and the reverse side 31b of the second substrate 31 is exposed, the reverse side 31b of the second substrate 31 and an upper surface of the resin 53 filling the recessed portions 31c are disposed on substantially the same plane.

Note that, in the resin grinding step S6, after the resin 53 formed on the reverse side 31b of the second substrate 31 is removed, the reverse side 31b of the second substrate 31 may slightly be ground by the grindstones 16. This makes it possible to finely adjust the thickness of the second substrate 31 and the thickness of the resin 53 filling the recessed portions 31c. Further, the upper surface side of the device chips 25 may slightly be ground by the grindstones 16 within such a range that the functionalities of the device chips 25 are not impaired.

However, when the resin 53 is ground by the grindstones 16 until the reverse side 31b of the second substrate 31 is exposed, impact is caused to the second substrate 31 when the grindstones 16 reach the second substrate 31, and an area (fragmentation layer) including fine irregularities is sometimes formed on the reverse side 31b of the second substrate 31. This fragmentation layer causes reduced strength of the second substrate 31. Hence, grinding of the resin 53 may be stopped immediately before the reverse side 31b of the second substrate 31 is exposed, and thereafter, polishing processing may be performed on the reverse side 31b of the second substrate 31.

A polishing apparatus is used in the polishing processing. The polishing apparatus includes a chuck table that holds a workpiece and a polishing unit that performs polishing processing on the workpiece. The polishing unit incorporates therein a spindle, and a disk-shaped polishing pad is mounted to the distal end portion of the spindle. By the laminated substrate 51 being held on the chuck table and the polishing pad being pressed against the laminated substrate 51 while the chuck table and the polishing pad are rotated, the laminated substrate 51 is polished. The polishing pad includes a disk-shaped base composed of metal, resin, or the like and a disk-shaped polishing layer fixed to a lower surface side of the base. For example, the polishing layer is formed with abrasive grains composed of $SiO_2$, green carborundum (GC), white alundum (WA), or the like being contained in a base member composed of non-woven fabric, urethane foam, or the like. For example, abrasive grains with an average grain size of 0.1 to 10 μm are used. Yet, the material of the polishing layer, the material of the abrasive grains, the grain size of the abrasive grains, and the like can appropriately be selected according to the material of the object to be polished, for example.

When the laminated substrate 51 is to be polished, first, the laminated substrate 51 is held on the chuck table in such a manner that the reverse side 31b (resin 53 side) of the second substrate 31 is exposed upward. Next, the positional relation between the chuck table and the polishing pad is adjusted such that the polishing layer of the polishing pad overlaps with the entire area of the second substrate 31. Then, while the chuck table and the polishing pad are rotated, the polishing layer of the polishing pad is pressed against the reverse side 31b of the second substrate 31. As a result, the resin 53 that remains on the reverse side 31b of the second substrate 31 is removed, and the reverse side 31b of the second substrate 31 is polished.

At the time of polishing the laminated substrate 51, polishing liquid containing no abrasive grains is supplied to the laminated substrate 51 and the polishing pad. As the polishing liquid, for example, chemical liquid, such as acidic polishing liquid or alkaline polishing liquid, or pure water may be used. As the acidic polishing liquid, an acidic solution in which permanganate or the like is solved is used, while, as the alkaline polishing liquid, an alkaline solution in which sodium hydroxide or potassium hydroxide is solved is used. Note that, in the case where the polishing layer contains no abrasive grains, slurry containing abrasive grains may be supplied to the laminated substrate 51 and the polishing pad. For example, the slurry contains, as free abrasive grains, abrasive grains composed of $SiO_2$, aluminum oxide ($Al_2O_3$), or the like. Alternatively, the laminated substrate 51 may be processed by dry polishing. In this case, during polishing of the laminated substrate 51, slurry or liquid (polishing liquid) such as pure water is not supplied to the laminated substrate 51 and the polishing pad.

The polishing layer of the polishing pad is configured with a soft member compared to the grindstones 16 (see FIG. 5). Hence, even if the polishing layer comes into contact with the second substrate 31, no fragmentation layer is formed on the reverse side 31b of the second substrate 31. As a result, reduced strength of the second substrate 31 is avoided. Further, continuing the polishing even after the resin 53 formed on the reverse side 31b of the second substrate 31 is removed makes it possible to finely adjust the thickness of the second substrate 31 and the thickness of the resin 53 filling the recessed portions 31c. At this time, even if the polishing layer of the polishing pad comes into contact with the device chips 25, the polishing layer is soft, so that no fragmentation layer is formed on the device chips 25.

Note that, in a case where there is no problem even if the resin 53 remains on the reverse side 31b of the second substrate 31 and the case where the resin 53 is supplied only to the recessed portions 31c and is not applied to the reverse side 31b of the second substrate 31, the resin grinding step S6 can be omitted.

As described above, in the present embodiment, after the first substrate 11 on which the device chips 25 are formed and the second substrate 31 including the recessed portions 31c are bonded together and the device chips 25 are housed in the recessed portions 31c, the second substrate 31 is ground, and the recessed portions 31c are exposed. Further, in a state in which the device chips 25 are supported on the planarized first substrate 11, the resin 53 is supplied to the recessed portions 31c to cover the device chips 25. Using the method described above reduces variation in the positions of the device chips 25 in the depth direction of the recessed portions 31c, compared to the case of supporting the device chips 25 at a bottom face of the recessed portions that are formed by such processing as dry etching and that have great variation in depth and great TTV. Consequently, a laminated substrate 51 with the device chips 25 having uniform height can be obtained.

Figure 11:
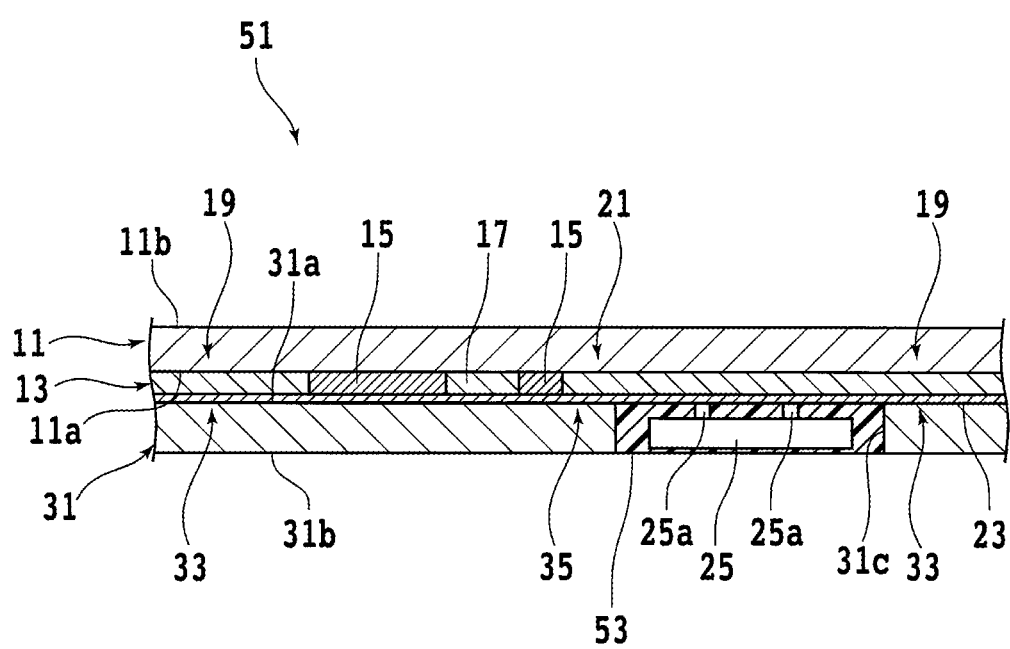
FIG. 11 is a cross sectional view illustrating part of the laminated substrate in which the first substrate is thinned.

Note that, after the bonding step S3 is performed, a grinding step of grinding and thinning the first substrate 11 may be performed at a predetermined timing. FIG. 11 is a cross sectional view illustrating part of the laminated substrate 51 in which the first substrate 11 has been thinned.

For example, after the resin 53 is ground in the resin grinding step S6, the reverse side 11b of the first substrate 11 may be ground by the grinding apparatus 2 (see FIG. 5) continuously used. In this case, the laminated substrate 51 is disposed on the chuck table 4 in such a manner that the reverse side 31b of the second substrate 31 faces the holding surface 4a and the reverse side 11b of the first substrate 11 is exposed upward. Then, while the chuck table 4 and the grinding wheel 12 are rotated, the grindstones 16 are caused to come into contact with the reverse side 11b of the first substrate 11, so that the reverse side 11b of the first substrate 11 is ground. As a result, the first substrate 11 is thinned, making it easier to form electrodes or divide the laminated substrate 51 as described later.

Next, predetermined processing is performed on the laminated substrate 51 as needed (processing step). In the following description, as one example, a case in which electrodes, wires, and the like are formed on the laminated substrate 51 and other device chips 25 are mounted on the laminated substrate 51 will be explained.

Figure 12A:
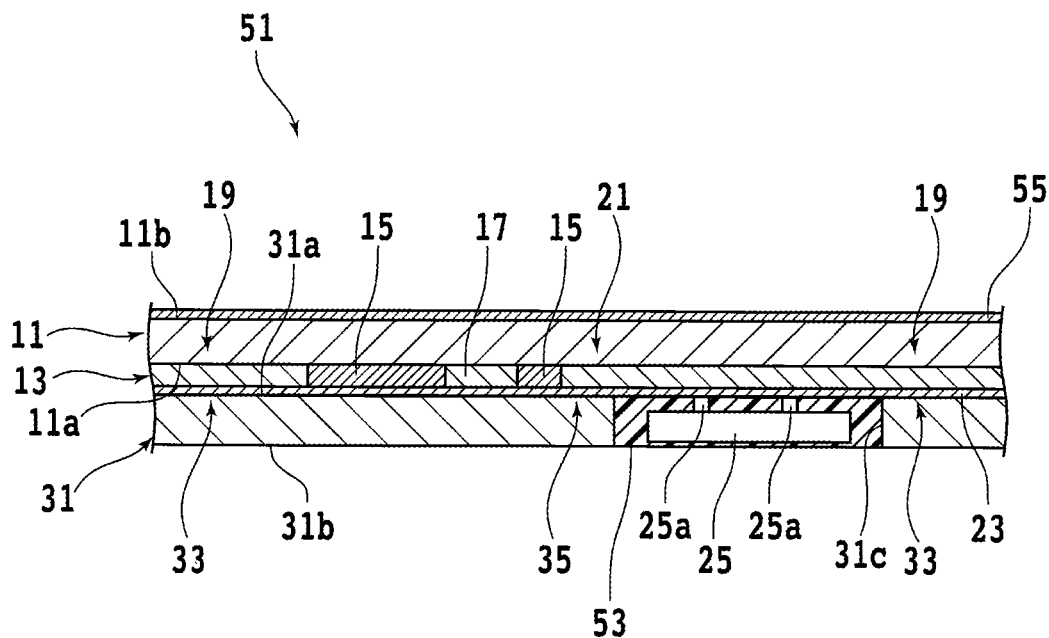
FIG. 12A is a cross sectional view illustrating part of the laminated substrate on which an insulation layer is formed.

First, an insulation layer is formed on the reverse side 11b of the first substrate 11. FIG. 12A is a cross sectional view illustrating part of the laminated substrate 51 on which the insulation layer denoted by 55 is formed. The insulation layer 55 is formed in such a manner as to cover the entire area of the reverse side 11b of the first substrate 11 and functions as an interlayer insulating film. For example, as the insulation layer 55, an insulating film composed of $SiO_2$, $Si_3N_4$, or resin is formed. There is no limitation on the method of forming the insulation layer 55; for example, chemical vapor deposition (CVD), sputtering, spin coating, or the like may be used.

Figure 12B:
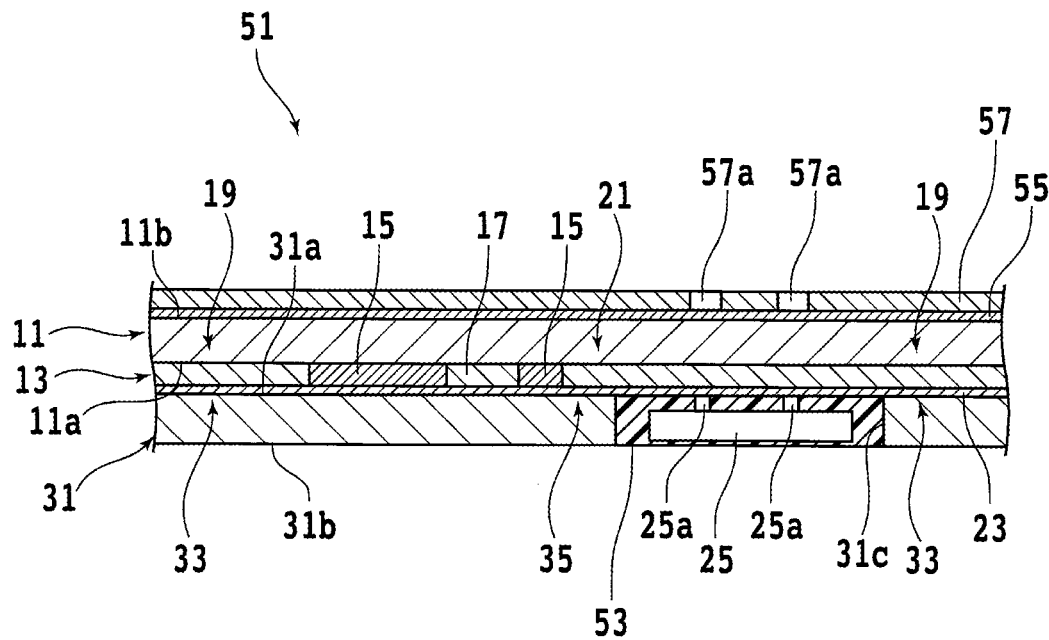
FIG. 12B is a cross sectional view illustrating part of the laminated substrate on which a mask layer is formed.

Next, a mask layer for forming through holes that reach the device chips 25 is formed. FIG. 12B is a cross sectional view illustrating part of the laminated substrate 51 on which the mask layer denoted by 57 is formed. When the mask layer 57 is to be formed, first, a resist composed of photosensitive resin is applied to the insulation layer 55. Then, the resist is patterned in such a manner that areas of the insulation layer 55 that overlap with the connection terminals 25a of the device chip 25 are exposed. As a result, the mask layer 57 including openings 57a in which part of the insulation layer 55 is exposed is formed on the insulation layer 55. Note that there are no limitations on the material to be used for and the method of forming the mask layer 57. For example, a film composed of water-soluble resin such as polyvinyl alcohol (PVA), polyethylene glycol (PEG), polyethylene oxide (PEO), and polyvinylpyrrolidone (PVP) may be formed on the insulation layer 55. In this case, patterning the film by application of a laser beam or the like allows the mask layer 57 composed of water-soluble resin to be formed.

Figure 13A:
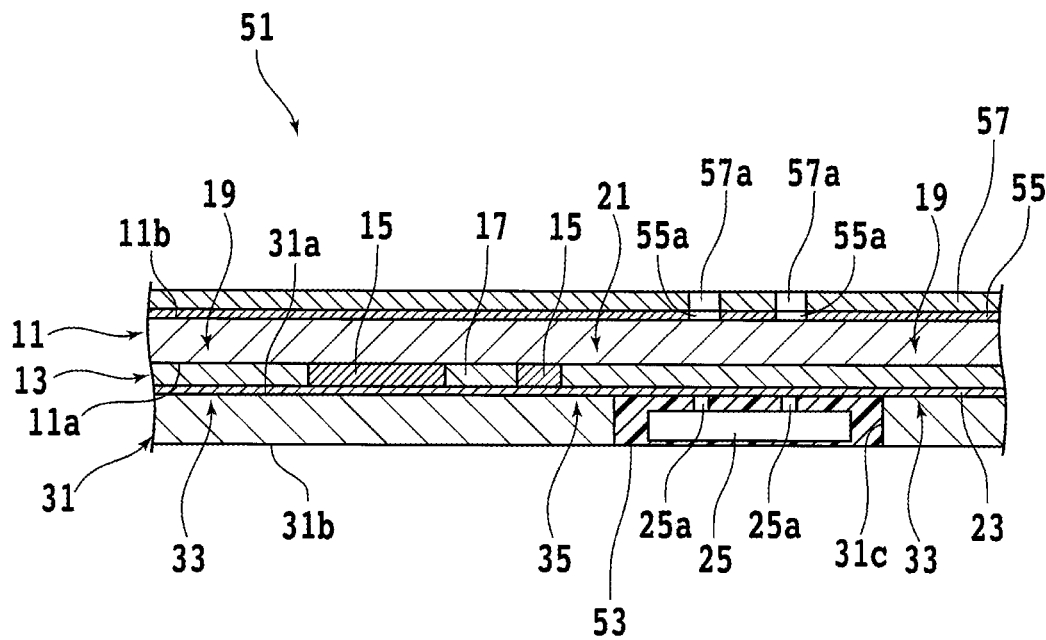
FIG. 13A is a cross sectional view illustrating part of the laminated substrate in which through holes are formed in the insulation layer.
Figure 13B:
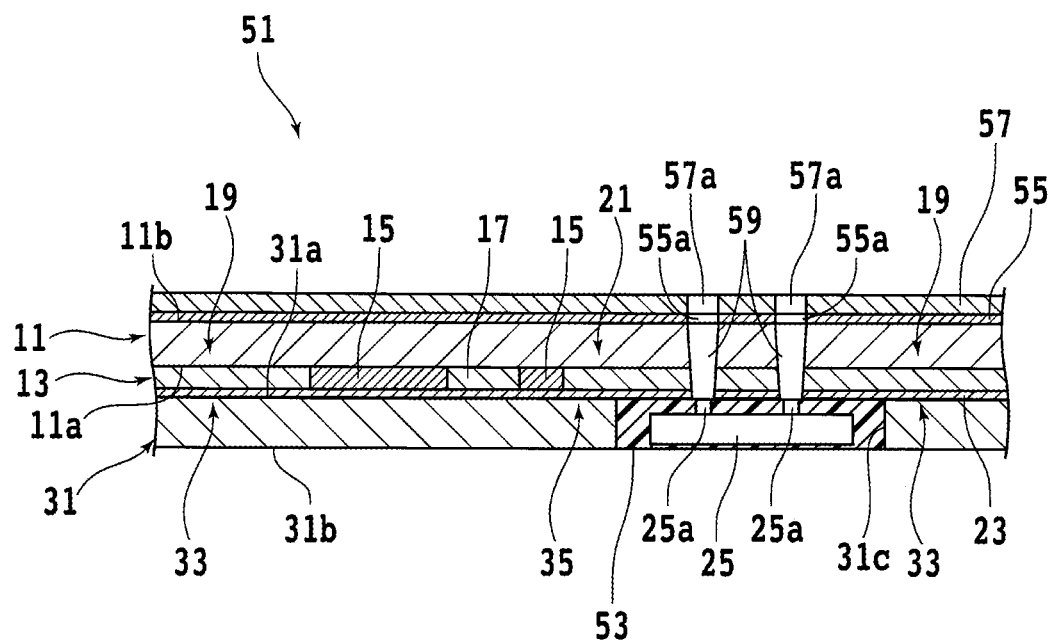
FIG. 13B is a cross sectional view illustrating part of the laminated substrate in which through holes are formed in the first substrate, a wiring layer, and an adhesive layer.

Next, through holes that reach the device chips 25 are formed. FIG. 13A is a cross sectional view illustrating part of the laminated substrate 51 in which the through holes denoted by 55a are formed in the insulation layer 55. FIG. 13B is a cross sectional view illustrating part of the laminated substrate 51 in which the through holes denoted by 59 are formed in the first substrate 11, the wiring layer 13, and the adhesive layer 23.

First, such a method as reactive ion etching (RIE) is used to form the through holes 55a in the insulation layer 55, as illustrated in FIG. 13A. Specifically, plasma etching gas is supplied to the insulation layer 55 via the openings 57a of the mask layer 57. As a result, etching gas acts on the areas of the insulation layer 55 that are exposed inside the openings 57a, and the insulation layer 55 is partially removed. Consequently, the through hole 55a that penetrates the insulation layer 55 in the thickness direction is formed at a position where the through hole 55a overlaps with the connection terminal 25a of the device chip 25. Note that there is no limitation on the method of forming the through hole 55a.

Subsequently, as illustrated in FIG. 13B, the through holes 59 that reach the recessed portions 31c of the second substrate 31 from the through holes 55a of the insulation layer 55 are formed. For example, RIE using the mask layer 57 is used to etch the first substrate 11, the wiring layer 13, and the adhesive layer 23, in this order. This allows the through hole 59 that penetrates the first substrate 11, the wiring layer 13, and the adhesive layer 23 in the thickness direction to be formed at a position where the through hole 59 overlaps with the connection terminal 25a of the device chip 25. Further, the connection terminal 25a of the device chip 25 is exposed at a lower end portion of the through hole 59. Note that the through hole 59 may be formed by what is generally called a Bosch process that repeats isotropic etching, formation of protective films, and anisotropic etching. Further, a mask layer for newly forming the through holes 59 may be formed by removal of the mask layer 57 after formation of the through holes 55a. That is, different mask layers may be used for formation of the through holes 55a and the formation of the through holes 59.

Figure 14A:
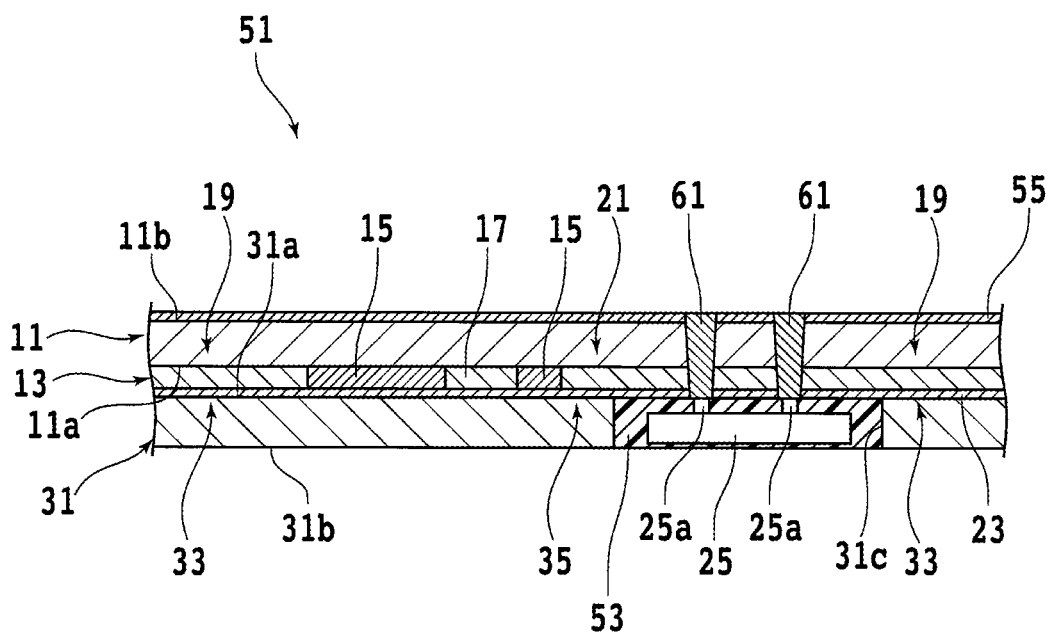
FIG. 14A is a cross sectional view illustrating part of the laminated substrate in which electrodes are formed.

Then, electrodes are formed in the through holes 55a and 59. FIG. 14A is a cross sectional view illustrating part of the laminated substrate 51 in which electrodes (through electrodes; via electrodes) 61 are formed. First, after the through holes 55a and 59 are formed, the mask layer 57 is removed. Then, inner walls of the through holes 55a and 59 are covered with insulating films. These insulating films insulate the first substrate 11 and the wiring layer 13 from the electrodes 61 described below. Next, the through holes 55a and 59 are filled with conductive materials such as copper, tungsten, or aluminum. As a result, the electrodes 61 are formed in the through holes 55a and 59. For example, the electrodes 61 composed of copper are formed by electrolytic plating. When the electrodes 61 are formed, upper end portions of the electrodes 61 are exposed on the surface of the insulation layer 55, while lower end portions of the electrodes 61 are connected to the connection terminals 25a of the device chips 25. This allows the device chips 25 to be connected to other electrodes, wires, and the like formed on the insulation layer 55.

Figure 14B:
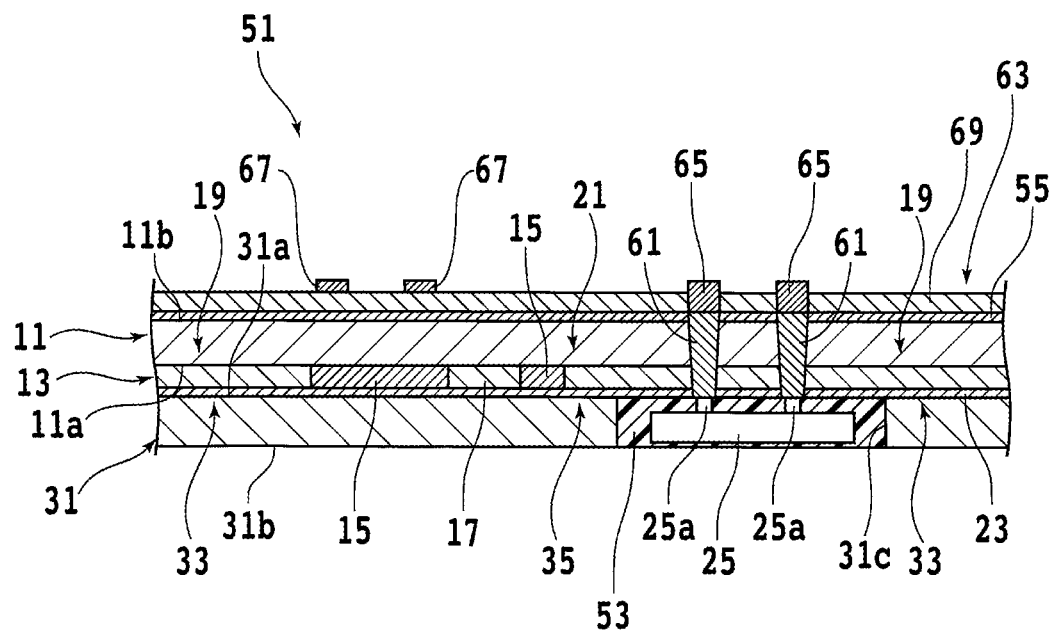
FIG. 14B is a cross sectional view illustrating part of the laminated substrate in which the wiring layer is formed.

Subsequently, a wiring layer is formed on the insulation layer 55. FIG. 14B is a cross sectional view illustrating part of the laminated substrate 51 on which the wiring layer denoted by 63 is formed. The wiring layer 63 includes various kinds of thin films such as a conductive film that functions as a wire, an electrode, a terminal, or the like and an insulating film that functions as an inter-later insulating film. The wiring layer 63 is formed over the entire surface of the insulation layer 55. For example, the wiring layer 63 includes connection electrodes 65 and 67 that are composed of metal such as copper and an insulation layer 69 that is composed of $SiO_2$, $Si_3N_4$, or the like and that is formed in such a manner as to surround the connection electrodes 65 and 67. Note that the connection electrodes 65 are connected to the electrodes 61, and the connection electrodes 67 are connected to other electrodes, wires, or the like included in the wiring layer 63. The method of forming the wiring layer 63 is similar to the method of forming the wiring layer 13 (see FIG. 1B and other relevant figures).

Figure 15:
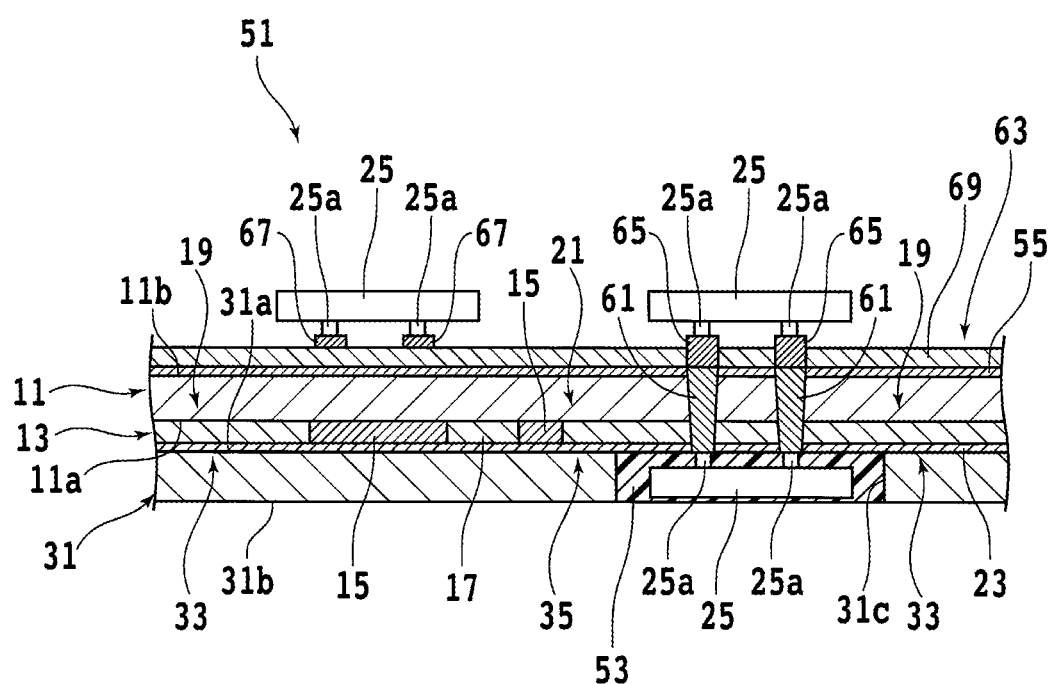
FIG. 15 is a cross sectional view illustrating part of the laminated substrate on which device chips are mounted.

Next, the device chips 25 are mounted on the laminated substrate 51. FIG. 15 is a cross sectional view illustrating part of the laminated substrate 51 on which the device chips 25 are mounted. For example, one device chip 25 is mounted on the wiring layer 63 in such a manner that the connection terminals 25a are connected to the connection electrodes 65. This allows the device chip 25 provided in the recessed portion 31c and the device chip 25 mounted on the wiring layer 63 to be connected to each other via the electrodes 61 and the connection electrodes 65. Further, another device chip 25 is mounted on the wiring layer 63 in such a manner that the connection terminals 25a are connected to the connection electrodes 67. This allows the device chip 25 to be connected to the wiring layer 63. Thereafter, the device chips 25 mounted on the wiring layer 63 are sealed by resin as needed.

As described above, mounting the device chips 25 on the wiring layer 63 side of the laminated substrate 51 allows the laminated substrate 51 including a plurality of device chips 25 stacked one on top of the other to be obtained. Note that the details of the process to be performed on the laminated substrate 51 are not limited to those described above and can appropriately be modified according to the specification of the package devices to be manufactured.

Figure 16A:
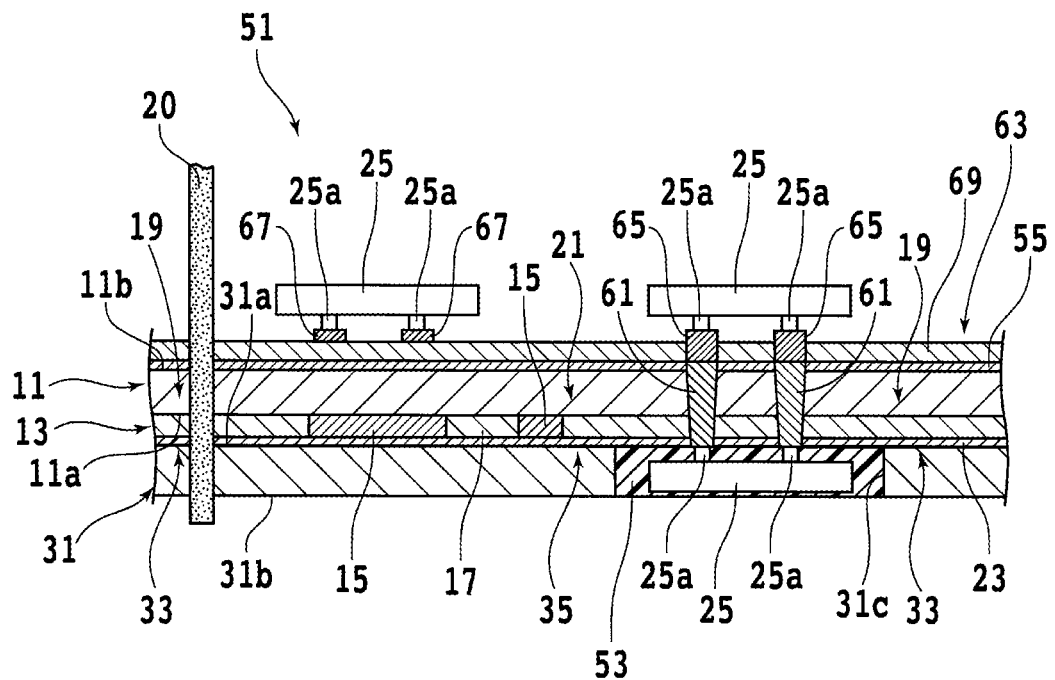
FIG. 16A is a cross sectional view illustrating part of the laminated substrate in a dividing step.

Next, a plurality of package devices each including the device chips 25 are manufactured by the first substrate 11 and the second substrate 31 being divided along the projected dicing lines 19 and 33 (dividing step S7). FIG. 16A is a cross sectional view illustrating part of the laminated substrate 51 in the dividing step S7.

In the dividing step S7, the laminated substrate 51 is cut by a cutting apparatus, for example. The cutting apparatus includes a chuck table that holds the laminated substrate 51 and a cutting unit that cuts the laminated substrate 51. To a distal end portion of the spindle that is incorporated in the cutting unit, an annular cutting blade 20 is mounted. As the cutting blade 20, for example, a hub-type cutting blade (hub blade) is used. The hub blade includes an annular base composed of metal or the like and an annular cutting edge formed along an outer circumferential edge of the base that are integrated. The cutting edge of the hub blade is configured with an electroformed abrasive stone in which abrasive grains including diamonds or the like are fixed by such a binder as nickel plating. Yet, a washer-type cutting blade (washer blade) may be used as the cutting blade 20. A washer blade includes an annular cutting edge in which abrasive grains are fixed by a binder including metal, ceramic, resin, or the like.

When the laminated substrate 51 is to be divided, first, the laminated substrate 51 is held on the chuck table of the cutting apparatus. For example, the laminated substrate 51 is disposed on the chuck table in such a manner that the reverse side 31b of the second substrate 31 faces a holding surface of the chuck table and the reverse side 11b (wiring layer 63 side) of the first substrate 11 is exposed upward.

Then, the chuck table is rotated, and the length direction of the predetermine ones of the projected dicing lines 19 and 33 is aligned with the processing feed direction (forward-rearward direction in FIG. 16A). Moreover, the position of the cutting blade 20 in the indexing feed direction (left-right direction in FIG. 16A) is adjusted in such a manner that the cutting blade 20 is disposed on an extension of the predetermined ones of the projected dicing lines 19 and 33. Further, the height of the cutting blade 20 is adjusted in such a manner that the lower end of the cutting blade 20 is disposed lower than the lower surface of the laminated substrate 51 (reverse side 31b of the second substrate 31).

Then, while the cutting blade 20 is rotated, the chuck table is moved along the processing feed direction. As a result, the laminated substrate 51 and the cutting blade 20 move relative to each other along the processing feed direction, and the cutting blade 20 cuts into the laminated substrate 51 along the projected dicing lines 19 and 33. Consequently, the laminated substrate 51 (first substrate 11, wiring layer 13, adhesive layer 23, second substrate 31, insulation layer 55, and wiring layer 63) is cut and divided along the projected dicing lines 19 and 33. Thereafter, the same steps are repeated, so that the laminated substrate 51 is cut along all of the projected dicing lines 19 and 33.

Figure 16B:
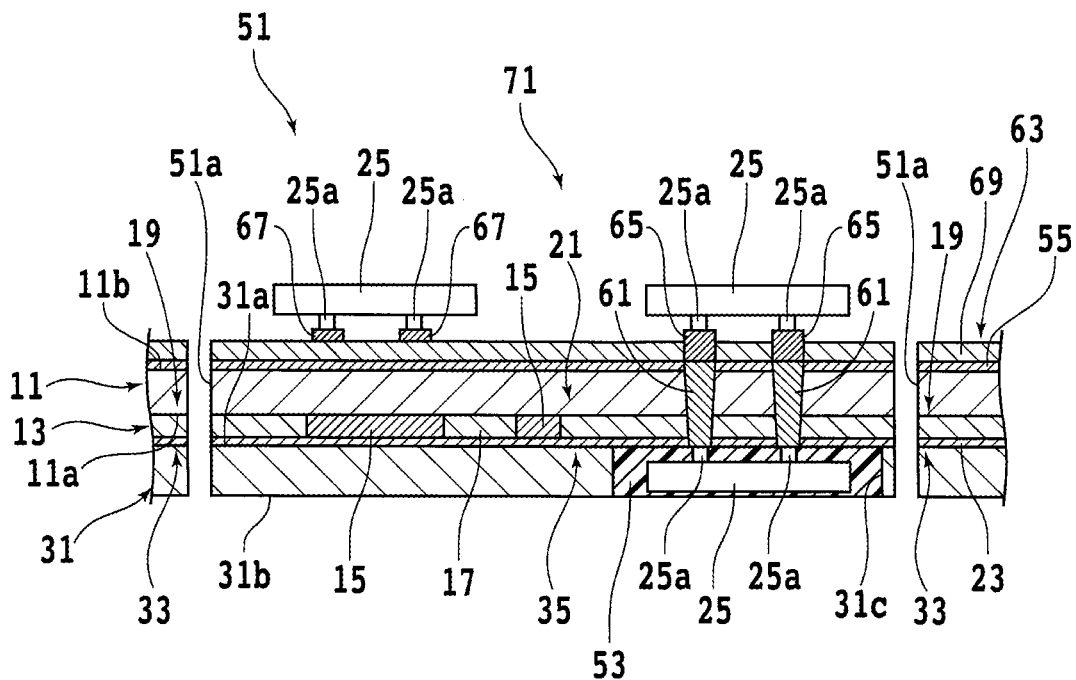
FIG. 16B is a cross sectional view illustrating part of the laminated substrate that has undergone the dividing step.

FIG. 16B is a cross sectional view illustrating part of the laminated substrate 51 that has undergone the diving step S7. When the laminated substrate 51 is cut along all of the projected dicing lines 19 and 33, the laminated substrate 51 is divided into a plurality of package devices 71. The package device 71 has a structure in which the device chip 25 housed in the recessed portion 31c of the second substrate 31 and the device chip 25 mounted on the wiring layer 63 are stacked one on top of the other. In this way, package devices 71 in which a plurality of device chips 25 are packaged are manufactured.

As described above, in the method of manufacturing package devices according to the present embodiment, after the first substrate 11 on which the device chips 25 are mounted and the second substrate 31 including the recessed portions 31c are bonded together and the device chips 25 are housed in the recessed portions 31c (see FIG. 7B), the second substrate 31 is ground, and the recessed portions 31c are exposed (see FIG. 8A). Following this, in a state in which the device chips 25 are supported by the flat first substrate 11, the resin 53 is supplied to the recessed portions 31c to cover the device chips 25 (see FIG. 10). Using the abovementioned method reduces the variation in the positions of the device chips 25 in the depth direction of the recessed portions 31c, compared to the case of supporting the device chips 25 at the bottom face of the recessed portions 31c that are formed by such processing as dry etching and that have great variation in the depth or great TTV. This allows the laminated substrate 51 with the device chips 25 having uniform height to be obtained. As a result, when the through holes 59 are formed in the laminated substrate 51 (see FIG. 13B), for example, the through holes 59 appropriately reach the device chips 25, avoiding connection failure between the device chips 25 and the electrodes 61 (see FIG. 14A).

Note that the structure, method, and other matters according to the embodiment described above can appropriately be modified and implemented to such an extent that no divergence from the scope of object of the present invention occurs.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of manufacturing package devices, comprising:
   a first substrate preparing step of preparing a first substrate including, on one surface, a plurality of mounting areas demarcated by a plurality of projected dicing lines in crisscross relation and having a device chip mounted in each of the plurality of mounting areas;
   a second substrate preparing step of preparing a second substrate including, in one surface, a plurality of recessed portions that are provided in areas corresponding to the mounting areas and that are capable of housing the device chips;
   a bonding step of bonding together the first substrate and the second substrate in such a manner that the device chips are housed in the recessed portions;
   a grinding step of, after the bonding step, grinding the other surface of the second substrate until the recessed portions are exposed;
   a resin molding step of, after the grinding step, supplying resin to the plurality of recessed portions and covering the device chips by the resin; and
   a dividing step of, after the resin molding step, dividing the first substrate and the second substrate along the projected dicing lines and manufacturing a plurality of package devices each including the device chips.

2. The method of manufacturing package devices according to claim 1, wherein
   the first substrate preparing step includes
      a planarizing step of planarizing the first substrate, and
      a mounting step of, after the planarizing step, mounting the device chips in the mounting areas.

3. The method of manufacturing package devices according to claim 1, further comprising:
   a resin grinding step of, after the resin molding step, grinding the resin.

\* \* \* \* \*